United States Patent
Hayashi

(10) Patent No.: US 7,785,421 B2
(45) Date of Patent: Aug. 31, 2010

(54) SUBSTRATE TREATMENT METHOD AND SUBSTRATE TREATMENT APPARATUS

(75) Inventor: Toyohide Hayashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 313 days.

(21) Appl. No.: 11/761,121

(22) Filed: Jun. 11, 2007

(65) Prior Publication Data
US 2007/0289611 A1    Dec. 20, 2007

(30) Foreign Application Priority Data
Jun. 19, 2006    (JP) .............................. 2006-169142

(51) Int. Cl.
*B08B 3/00* (2006.01)
(52) U.S. Cl. ............................. 134/26; 134/18; 134/33
(58) Field of Classification Search ............... 134/26, 134/18, 33, 42, 94.1, 95.1, 95.2
See application file for complete search history.

(56) References Cited

U.S. PATENT DOCUMENTS

| | | | |
|---|---|---|---|
| 2001/0047595 A1* | 12/2001 | Mehmandoust | ............... 34/443 |
| 2002/0108642 A1* | 8/2002 | Ogasawara et al. | ...... 134/102.1 |
| 2002/0189643 A1* | 12/2002 | Chen et al. | ...................... 134/6 |
| 2003/0159713 A1* | 8/2003 | Park et al. | ...................... 134/2 |
| 2003/0170988 A1 | 9/2003 | Izumi et al. | |
| 2008/0142054 A1* | 6/2008 | Eitoku | ......................... 134/30 |

FOREIGN PATENT DOCUMENTS

| | | |
|---|---|---|
| JP | 2002-289574 | 10/2002 |
| JP | 2003-92280 | 3/2003 |
| WO | WO 0100338 A1 * | 1/2001 |

* cited by examiner

*Primary Examiner*—Michael Kornakov
*Assistant Examiner*—Naomi Birbach
(74) *Attorney, Agent, or Firm*—Ostrolenk Faber LLP

(57) ABSTRACT

The substrate treatment method includes: a cleaning step of supplying deionized water to a major surface of a substrate to clean the substrate; a pre-drying treatment step of supplying a pre-drying treatment liquid containing an organic solvent more volatile than the deionized water to the major surface of the substrate after the cleaning step to replace deionized water remaining on the major surface with the pre-drying treatment liquid; and a drying step of removing the pre-drying treatment liquid supplied to the major surface of the substrate after the pre-drying treatment step to dry the substrate. The pre-drying treatment step includes: a deionized water/organic solvent mixture supplying step of supplying a mixture of the deionized water and the organic solvent as the pre-drying treatment liquid to the major surface of the substrate; and a mixing ratio changing step of increasing the proportion of the organic solvent in the mixture of the deionized water and the organic solvent during the deionized water/organic solvent mixture supplying step.

6 Claims, 4 Drawing Sheets

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus for cleaning and drying a substrate. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, and substrates for photo masks.

2. Description of Related Art

In production processes for semiconductor devices and liquid crystal display devices, substrates such as semiconductor wafers and glass substrates for the liquid crystal display devices are generally treated with treatment liquids. More specifically, such a substrate is treated with a chemical agent by supplying the chemical agent to a major surface of the substrate, and then a cleaning process is performed to rinse away the chemical agent from the substrate by supplying deionized water to the major surface of the substrate supplied with the chemical agent (see, for example, JP-A-2003-92280).

After the cleaning process, a drying process is performed on the substrate to remove the deionized water remaining on the substrate and dry the substrate. Exemplary methods for the drying process include an IPA (isopropyl alcohol) vapor drying method, a Marangoni drying method and a Marangoni spin-drying method, in which IPA is used for replacing the deionized water on the substrate with IPA for drying the substrate.

However, the prior art drying methods using IPA often fail to completely dry the substrate. Where a recess such as a hole or a trench having a high aspect ratio is provided in the major surface of the substrate, for example, only deionized water present in an upper portion of the recess of the substrate is replaced with IPA, and deionized water present in a lower portion (bottom portion) of the recess of the substrate is not sufficiently replaced with IPA. Therefore, the deionized water still remains in the bottom portion of the recess of the high aspect ratio even after the drying process. The remaining deionized water may form water marks in the recess, thereby resulting in deterioration of the characteristics of a device to be formed on the substrate.

More specifically, IPA has a lower surface tension than the deionized water and, therefore, more easily enters the recess of the high aspect ratio than the deionized water. However, IPA does not easily mingle with the deionized water. Even if IPA is brought into contact with the deionized water, the deionized water only partly mingles with IPA in an interface between the deionized water and IPA. With the deionized water present in the fine recess of the high aspect ratio, therefore, IPA merely mingles with the deionized water present in the upper portion of the recess, but does not reach the bottom portion of the recess. Therefore, only the deionized water present in the upper portion of the recess is replaced with IPA, and the deionized water present in the bottom portion of the recess remains to result in water marks.

SUMMARY OF THE INVENTION

It is an object of the present invention to provide a substrate treatment method and a substrate treatment apparatus which are capable of drying a substrate while suppressing formation of water marks.

A substrate treatment method according to the present invention comprises: a cleaning step of supplying deionized water to a major surface of a substrate to be treated to clean a substrate; a pre-drying treatment step of supplying a pre-drying treatment liquid containing an organic solvent more volatile than the deionized water to the major surface of the substrate after the cleaning step to replace deionized water remaining on the major surface with the pre-drying treatment liquid; and a drying step of removing the pre-drying treatment liquid supplied to the major surface of the substrate after the pre-drying treatment step to dry the substrate. The pre-drying treatment step includes: a deionized water/organic solvent mixture supplying step of supplying a mixture of the deionized water and the organic solvent as the pre-drying treatment liquid to the major surface of the substrate; and a mixing ratio changing step of increasing the proportion of the organic solvent in the mixture of the deionized water and the organic solvent during the deionized water/organic solvent mixture supplying step.

According to the present invention, the cleaning step is first performed to clean the substrate to be treated by supplying the deionized water to the major surface of the substrate, and then the deionized water/organic solvent mixture supplying step is performed to replace the deionized water remaining on the major surface with the pre-drying treatment liquid which is the mixture of the deionized water and the organic solvent more volatile than the deionized water by supplying the pre-drying treatment liquid to the major surface of the substrate. During the deionized water/organic solvent mixture supplying step, the mixing ratio changing step is performed to increase the proportion of the organic solvent in the pre-drying treatment liquid. That is, a pre-drying treatment liquid mainly containing the deionized water is supplied to the major surface of the substrate at the initial stage of the deionized water/organic solvent mixture supplying step, and a pre-drying treatment liquid mainly containing the organic solvent is supplied to the major surface of the substrate at the final stage of the deionized water/organic solvent mixture supplying step.

Since the pre-drying treatment liquid to be supplied to the major surface of the substrate at the initial stage of the deionized water/organic solvent mixture supplying step is close in composition to the deionized water, the pre-drying treatment liquid easily mingles with the deionized water. The pre-drying treatment liquid to be thereafter supplied to the substrate during the increase of the proportion of the organic solvent in the pre-drying treatment liquid in the deionized water/organic solvent mixture supplying step is close in composition to the pre-drying treatment liquid present on the substrate. Therefore, the pre-drying treatment liquid newly supplied onto the substrate properly mingles with the pre-drying treatment liquid present on the substrate. Thus, the deionized water present on the substrate is assuredly replaced with the organic solvent by increasing the proportion of the organic solvent in the pre-drying treatment liquid to be supplied onto the substrate. Even if a recess such as a hole having a high aspect ratio is provided in the major surface of the substrate, for example, the initially supplied pre-drying treatment liquid easily mingles with deionized water remaining in the recess of the high aspect ratio. The thereafter supplied pre-drying treatment liquid which contains the organic solvent in an increased proportion easily mingles with the liquid in the recess of the high aspect ratio. Thus, the deionized water present in the recess of the high aspect ratio is assuredly replaced with the organic solvent.

In this manner, the deionized water remaining on the major surface of the substrate is replaced with the more volatile pre-drying treatment liquid and finally with the pre-drying treatment liquid mainly containing the organic solvent by increasing the proportion of the organic solvent in the pre-drying treatment liquid during the deionized water/organic solvent mixture supplying step. Thus, the substrate is speedily and sufficiently dried in the drying step performed after the deionized water/organic solvent mixture supplying step. Even if the substrate has the recess of the high aspect ratio in the major surface thereof, the formation of water marks in the recess is suppressed or prevented.

Further, the proportion of the organic solvent in the pre-drying treatment liquid may be progressively increased as the deionized water/organic solvent mixture supplying step proceeds. Thus, the deionized water remaining on the major surface of the substrate is smoothly replaced with the more volatile pre-drying treatment liquid, and finally with the pre-drying treatment liquid mainly containing the organic solvent.

The pre-drying treatment liquid to be supplied at the final stage of the deionized water/organic solvent mixture supplying step preferably contains the organic solvent in a proportion of 100%. That is, the final stage of the deionized water/organic solvent mixture supplying step is preferably an organic solvent supplying step in which only the organic solvent is supplied to the substrate. Thus, the substrate is speedily and sufficiently dried in the drying step performed after the organic solvent supplying step.

The organic solvent more volatile than the deionized water is preferably an organic solvent which has a lower surface tension with respect to the substrate and a higher vapor pressure (lower boiling point) than the deionized water. That is, where the organic solvent has a lower surface tension than the deionized water, the deionized water present on the substrate is more assuredly replaced with the organic solvent and contaminants (a residual chemical agent and the like) present on the substrate are more assuredly removed, because the organic solvent easily enters a fine pattern formed on the substrate. Further, where the organic solvent has a higher vapor pressure than the deionized water, the substrate is more speedily and sufficiently dried, because the organic solvent more easily evaporates than the deionized water. Where the organic solvent is soluble in the deionized water, the replacement of the deionized water with the mixture of the organic solvent and the deionized water and the change of the mixing ratio for the mixture are facilitated.

The organic solvent more volatile than the deionized water is an organic solvent containing one or more of methanol, ethanol, acetone, IPA (isopropyl alcohol), an HFE (hydrofluoroether) and MEK (methyl ethyl ketone). That is, usable examples of the organic solvent include alcohols such as methanol, ethanol and IPA, ethers such as HFEs, and ketones such as acetone and MEK. The pre-drying treatment liquid may be prepared by mixing any one of these organic solvents with the deionized water, or by mixing two or more of the organic solvents with the deionized water. Particularly, the aforementioned HFEs are insoluble (less soluble) in the deionized water, and each have a greater specific gravity than the deionized water.

The mixture of the deionized water and the organic solvent containing one or more of methanol and other organic solvents described above is supplied as the pre-drying treatment liquid to the major surface of the substrate, whereby the deionized water remaining in the recess is replaced with the pre-drying treatment liquid. Thus, the formation of water marks in the recess is suppressed.

The pre-drying treatment liquid may contain a first organic solvent and a second organic solvent. In this case, the deionized water/organic solvent mixture supplying step may be the step of supplying a mixture of the deionized water and the first organic solvent as the pre-drying treatment liquid to the major surface of the substrate, and the mixing ratio changing step may be the step of increasing the proportion of the first organic solvent in the mixture of the deionized water and the first organic solvent during the deionized water/organic solvent mixture supplying step. The pre-drying treatment step may further include a mixed organic solvent supplying step of supplying a mixture of the first organic solvent and the second organic solvent (preferably not containing the deionized water) as the pre-drying treatment liquid to the major surface of the substrate, and an organic solvent mixing ratio changing step of increasing the proportion of the second organic solvent in the mixture of the first organic solvent and the second organic solvent during the mixed organic solvent supplying step.

The mixed organic solvent supplying step may be performed after the deionized water/organic solvent mixture supplying step. More specifically, the mixed organic solvent supplying step may be performed after the proportion of the deionized water is reduced to zero and only the first organic solvent is supplied at the final stage of the deionized water/organic solvent mixture supplying step. Further, the mixed organic solvent supplying step may be started at the final stage of the deionized water/organic solvent mixture supplying step. That is, the deionized water/organic solvent mixture supplying step and the mixed organic solvent supplying step may be performed in parallel for a certain period of time. In this case, a mixture containing the deionized water, the first organic solvent and the second organic solvent may be supplied at the initial stage of the mixed organic solvent supplying step.

In the aforementioned method, the deionized water/organic solvent mixture supplying step is performed to supply the mixture of the deionized water and the first organic solvent as the pre-drying treatment liquid to the major surface of the substrate after the cleaning step and, during the deionized water/organic solvent mixture supplying step, the mixing ratio changing step is performed to increase the proportion of the first organic solvent in the mixture of the deionized water and the first organic solvent. That is, the pre-drying treatment liquid mainly containing the deionized water is supplied to the major surface of the substrate at the initial stage of the deionized water/organic solvent mixture supplying step, and a pre-drying treatment liquid mainly containing the first organic solvent is supplied to the major surface of the substrate at the final stage of the deionized water/organic solvent mixture supplying step. The mixing ratio changing step may be performed to progressively increase the proportion of the first organic solvent as the deionized water/organic solvent mixture supplying step proceeds.

After the mixture of the deionized water and the first organic solvent is supplied to the substrate, the mixed organic solvent supplying step is performed to supply the mixture of the first organic solvent and the second organic solvent as the pre-drying treatment liquid to the major surface of the substrate and, during the mixed organic solvent supplying step, the organic solvent mixing ratio changing step is performed to increase the proportion of the second organic solvent in the mixture of the first and second organic solvents. That is, the pre-drying treatment liquid mainly containing the first organic solvent is supplied to the major surface of the substrate at the initial stage of the mixed organic solvent supplying step, and a pre-drying treatment liquid mainly containing the second organic solvent is supplied to the major surface of the substrate at the final stage of the mixed organic solvent supplying step.

Thus, the deionized water remaining on the major surface of the substrate is first replaced with the mixture of the deionized water and the first organic solvent, and finally with the mixture of the first and second organic solvents. Since the pre-drying treatment liquid to be supplied to the substrate is close in composition to a liquid remaining on the major surface of the substrate (a liquid containing one or more of the deionized water, the first organic solvent and the second organic solvent), the liquid present on the substrate easily mingles with the pre-drying treatment liquid and is easily replaced with the pre-drying treatment liquid.

The pre-drying treatment liquid to be supplied at the final stage of the mixed organic solvent supplying step may contain the second organic solvent in a proportion of 100%. That is, the final stage of the mixed organic solvent supplying step may be a second organic solvent supplying step of supplying only the second organic solvent. Thus, the substrate is more speedily and sufficiently dried in the drying step performed after the mixed organic solvent supplying step.

The second organic solvent is preferably more volatile than the first organic solvent. In this case, the mixture of the first and second organic solvents to be supplied at the final stage of the mixed organic solvent supplying step mainly contain the second organic solvent which is more volatile than the first organic solvent, so that the substrate is more speedily and sufficiently dried. Therefore, the formation of water marks is more effectively suppressed.

The second organic solvent more volatile than the first organic solvent is preferably an organic solvent which is at least slightly soluble in the first organic solvent and has a lower surface tension with respect to the substrate and a higher vapor pressure than the first organic solvent. More specifically, where IPA is used as the first organic solvent, for example, an HFE may be used as the second organic solvent.

The first organic solvent is preferably more soluble in the deionized water than the second organic solvent. In this case, the first organic solvent easily dissolves in the deionized water and easily mingles with the deionized water, while the first and second organic solvents easily dissolve in each other and easily mingle with each other. Therefore, the replacement with the mixture of the first organic solvent and the second organic solvent is facilitated. More specifically, where IPA is used as the first organic solvent, for example, an HFE may be used as the second organic solvent.

Before the cleaning step, the major surface of the substrate may be hydrophobic. In this case, even a substrate treated with hydrofluoric acid (chemical agent) and hence having a hydrophobic major surface can be properly dried, while the formation of water marks is suppressed. In particular, a substrate having a fine recess of a high aspect ratio in a surface thereof is liable to suffer from water marks. However, the present invention ensures high quality cleaning of such a substrate.

The pre-drying treatment step preferably further includes a stirring step of stirring the pre-drying treatment liquid before supplying the pre-drying treatment liquid to the major surface of the substrate. In this case, the pre-drying treatment liquid obtained by sufficient mixing is supplied to the major surface of the substrate. Thus, the pre-drying treatment liquid newly supplied to the major surface of the substrate easily mingles with the liquid remaining on the major surface of the substrate, so that the liquid present on the substrate is efficiently replaced with the pre-drying treatment liquid.

The treatment method preferably further comprises a substrate rotating step of rotating the substrate about an axis intersecting the major surface of the substrate, and the substrate rotating step is preferably performed in parallel with the cleaning step, the pre-drying treatment step and the drying step. In this case, the deionized water or the pre-drying treatment liquid is supplied to the vicinity of the rotation center of the major surface of the rotated substrate, whereby the supplied deionized water or pre-drying treatment liquid receives a centrifugal force generated by the rotation of the substrate to spread over the entire major surface of the substrate. Thus, the cleaning step and the pre-drying treatment step are performed on the entire major substrate of the substrate.

Further, the rotation speed of the substrate may be increased to a higher level after the pre-drying treatment step to spin off the pre-drying treatment liquid from the major surface of the substrate by the centrifugal force for drying the substrate.

A substrate treatment apparatus according to the present invention comprises: a deionized water supplying unit arranged to supply deionized water to a major surface of a substrate to be treated; a pre-drying treatment liquid preparing unit arranged to prepare a pre-drying treatment liquid containing an organic solvent more volatile than the deionized water by mixing a plurality of treatment liquids including the deionized water; a pre-drying treatment liquid supplying unit arranged to supply the pre-drying treatment liquid prepared by the pre-drying treatment liquid preparing unit to the major surface of the substrate; a mixing ratio changing unit arranged to change the mixing ratio of the treatment liquids to be mixed by the pre-drying treatment liquid preparing unit; and a drying unit arranged to dry the substrate.

The substrate treatment apparatus preferably further comprises a control unit arranged to cause the deionized water supplying unit to supply the deionized water to the major surface of the substrate to perform a cleaning step to clean the substrate, cause the pre-drying treatment liquid supplying unit to supply the pre-drying treatment liquid to the major surface of the substrate after the cleaning step to perform a pre-drying treatment step to replace deionized water remaining on the major surface with the pre-drying treatment liquid, cause the mixing ratio changing unit to change the mixing ratio of the treatment liquids to be mixed by the pre-drying treatment liquid preparing unit during the pre-drying treatment step to perform a mixing ratio changing step to increase the proportion of the organic solvent in the pre-drying treatment liquid, and cause the drying unit to remove the pre-drying treatment liquid supplied to the major surface of the substrate after the pre-drying treatment step to perform a drying step to dry the substrate.

The substrate treatment apparatus described above is capable of changing the mixing ratio of the treatment liquids in the pre-drying treatment liquid to be supplied to the substrate, so that the substrate can be treated in a manner suitable for the drying of the substrate.

More specifically, the deionized water supplying unit supplies the deionized water to the major surface of the substrate to perform the cleaning step to clean the substrate, and then the pre-drying treatment liquid supplying unit supplies the pre-drying treatment liquid to the major surface of the substrate to perform the pre-drying treatment step to replace the deionized water remaining on the major surface with the pre-drying treatment liquid. During the pre-drying treatment step, the mixing ratio changing unit performs the mixing ratio changing step to increase the proportion of the organic solvent in the pre-drying treatment liquid.

Thus, a pre-drying treatment liquid mainly containing the deionized water is supplied to the major surface of the substrate at the initial stage of the pre-drying treatment step, while a pre-drying treatment liquid mainly containing the organic solvent is supplied to the major surface of the substrate at the final stage of the pre-drying treatment step. Therefore, the deionized water present on the substrate properly mingles with the pre-drying treatment liquid supplied onto the substrate at the initial stage of the pre-drying treatment step, and a liquid subsequently present on the substrate properly mingles with the pre-drying treatment liquid newly supplied onto the substrate. Therefore, the deionized water remaining on the major surface of the substrate after the cleaning step is assuredly replaced with the organic solvent by increasing the proportion of the organic solvent in the pre-drying treatment liquid. Thus, the substrate is speedily and sufficiently dried by the drying unit in the drying step, so that the presence of the deionized water on the substrate after the drying step can be effectively suppressed or prevented. This makes it possible to properly dry the substrate, while suppressing the formation of water marks.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
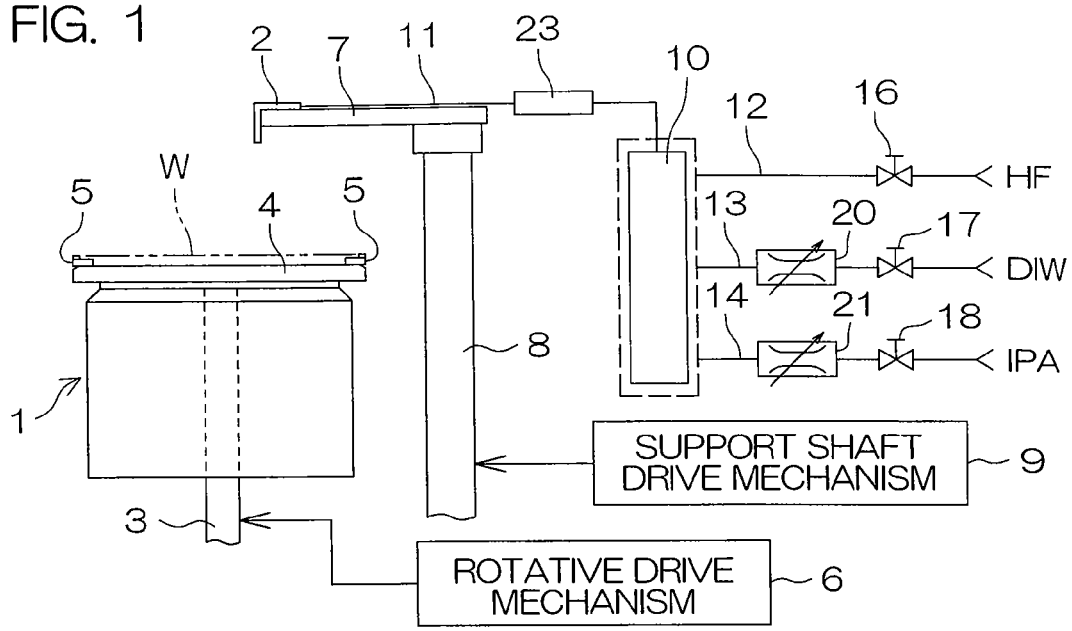
FIG. 1 is a schematic diagram for explaining the construction of a substrate treatment apparatus according to a first embodiment of the present invention.

FIG. 1 is a schematic diagram for explaining the construction of a substrate treatment apparatus according to a first embodiment of the present invention. The substrate treatment apparatus is of a single substrate treatment type, which is adapted to treat a single substrate W (in this embodiment, a silicon semiconductor wafer hereinafter referred to simply as "wafer W") at a time by supplying a treatment liquid (a liquid containing one or more of a chemical agent, deionized water and an organic solvent) to the wafer W. The substrate treatment apparatus includes a spin chuck 1 as a substrate holding/rotating mechanism which generally horizontally holds and rotates the wafer W, and a nozzle 2 as a treatment liquid supplying unit which supplies the treatment liquid to a surface (an upper surface or a major surface) of the wafer W held by the spin chuck 1.

The spin chuck 1 includes, for example, a rotation shaft 3 extending generally vertically, a disk-shaped spin base 4 fixed to an upper end of the rotation shaft 3, and a plurality of holding members 5 arranged in a peripheral portion of the spin base 4. The holding members 5 are disposed circumferentially in association with the outer periphery of the wafer W to cooperatively hold the wafer W generally horizontally in abutment against the circumferential surface of the wafer W at a plurality of different positions. A rotative drive mechanism 6 including a drive source such as a motor is coupled to the rotation shaft 3. By inputting a drive force to the rotation shaft 3 from the rotative drive mechanism 6 with the wafer W being held by the plurality of holding members 5, the wafer W is rotated about a center axis of the rotation shaft 3 which is an axis intersecting the surface of the wafer W.

The construction of the spin chuck 1 is not limited to that described above, but a spin chuck of a vacuum suction type (vacuum chuck), for example, may be employed which is adapted to generally horizontally hold the wafer W by sucking a lower surface of the wafer W by vacuum and, in this state, rotate the wafer W about a generally vertical axis.

The nozzle 2 is attached to a distal end of an arm 7 disposed above the spin chuck 1. The arm 7 is supported by a support shaft 8 extending generally vertically, and extends generally horizontally from an upper end of the support shaft 8. The support shaft 8 is rotatable about its center axis. The support shaft 8 is rotated by a support shaft drive mechanism 9 coupled to the support shaft 8, whereby the nozzle 2 is moved to be located above the wafer W held by the spin chuck 1 and retracted from above of the spin chuck 1 to be located in a standby position. Further, the support shaft 8 is reciprocally rotated within a predetermined angular range, whereby the arm 7 is pivoted above the wafer W held by the spin chuck 1. Thus, a treatment liquid supply position at which the treatment liquid is supplied from the nozzle 2 is scanned (moved) on the surface of the wafer W held by the spin chuck 1. The support shaft 8 and the support shaft drive mechanism 9 constitute a nozzle movement mechanism which moves the treatment liquid supply position on the wafer W.

The treatment liquid is supplied to the nozzle 2 from a treatment liquid supply channel 11 through a mixing valve 10 (pre-drying treatment liquid preparing unit). A hydrofluoric acid supply channel 12, a deionized water supply channel 13 and an IPA supply channel 14 are connected to the mixing valve 10. To the mixing valve 10, hydrofluoric acid (HF) as a chemical agent is supplied from the hydrofluoric acid supply channel 12, and deionized water (DIW) is supplied from the deionized water supply channel 13. Further, IPA as an organic solvent which is more easily dried (more volatile) than the deionized water and slightly soluble in the deionized water is supplied to the mixing valve 10 from the IPA supply channel 14.

A hydrofluoric acid valve 16 for controlling the supply of hydrofluoric acid to the mixing valve 10 is provided in the hydrofluoric acid supply channel 12. A deionized water valve 17 for controlling the supply of the deionized water to the mixing valve 10 and a flow control valve 20 for controlling the flow rate of the deionized water to be supplied to the mixing valve 10 are provided in the deionized water supply channel 13. An IPA valve 18 for controlling the supply of IPA to the mixing valve 10 and a flow control valve 21 for controlling the flow rate of IPA to be supplied to the mixing valve 10 are provided in the IPA supply channel 14. The deionized water supply channel 13, the deionized water valve 17 and the like constitute a deionized water supplying unit. Further, the deionized water supply channel 13, the IPA supply channel 14, the deionized water valve 17, the IPA valve 18 and the like constitute a pre-drying treatment liquid supplying unit. The flow control valves 20, 21 and the like constitute a mixing ratio changing unit.

Where a plurality of treatment liquids are supplied to the mixing valve 10, these treatment liquids are mixed in the mixing valve 10, and the resulting mixture is supplied to the treatment liquid supply channel 11. Further, the mixture is stirred in a finned stirring communication pipe 23 provided in the treatment liquid supply channel 11. Thus, a mixture prepared by sufficiently mixing the plurality of treatment liquids is supplied to the nozzle 2.

The finned stirring communication pipe 23 includes a pipe member, and a plurality of stirring fins of rectangular plates which are each twisted approximately 180 degrees about an axis extending in a liquid flow direction and arranged along a pipe axis in the pipe member with their twist angular positions alternately offset by 90 degrees. For example, an inline mixer available from Noritake Company Limited and Advance Electric Company Incorporated under the trade name of MX Series Inline Mixer may be employed.

Figure 2:
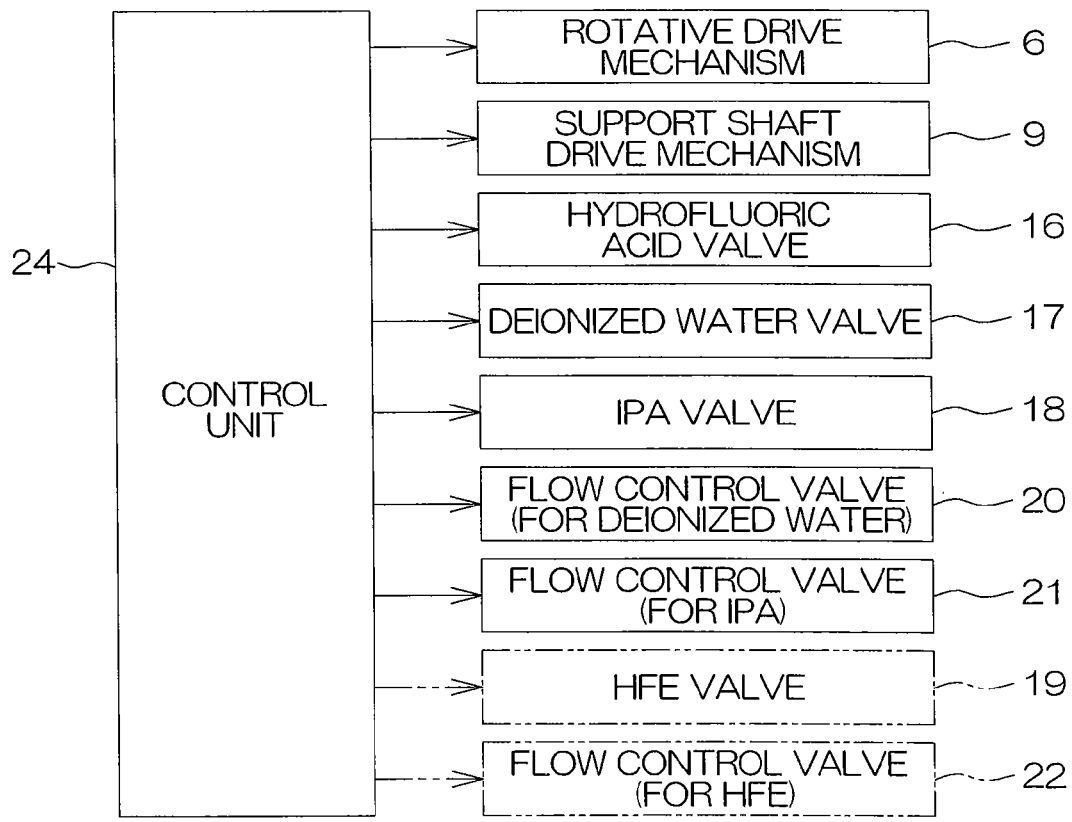
FIG. 2 is a block diagram showing an arrangement for controlling the substrate treatment apparatus.

FIG. 2 is a block diagram showing an arrangement for controlling the substrate treatment apparatus. The substrate treatment apparatus includes a control unit 24. The control unit 24 controls the operations of the rotative drive mechanism 6 and the support shaft drive mechanism 9. Further, the control unit 24 controls the supply of hydrofluoric acid to the mixing valve 10 by opening and closing the hydrofluoric acid valve 16, controls the supply of the deionized water to the mixing valve 10 by opening and closing the deionized water valve 17, and controls the supply of IPA to the mixing valve 10 by opening and closing the IPA valve 18. Furthermore, the control unit 24 controls the flow rate of the deionized water to be supplied to the mixing valve 10 by controlling the opening degree of the flow control valve 20, and controls the flow rate of IPA to be supplied to the mixing valve 10 by controlling the opening degree of the flow control valve 21.

Figure 3:
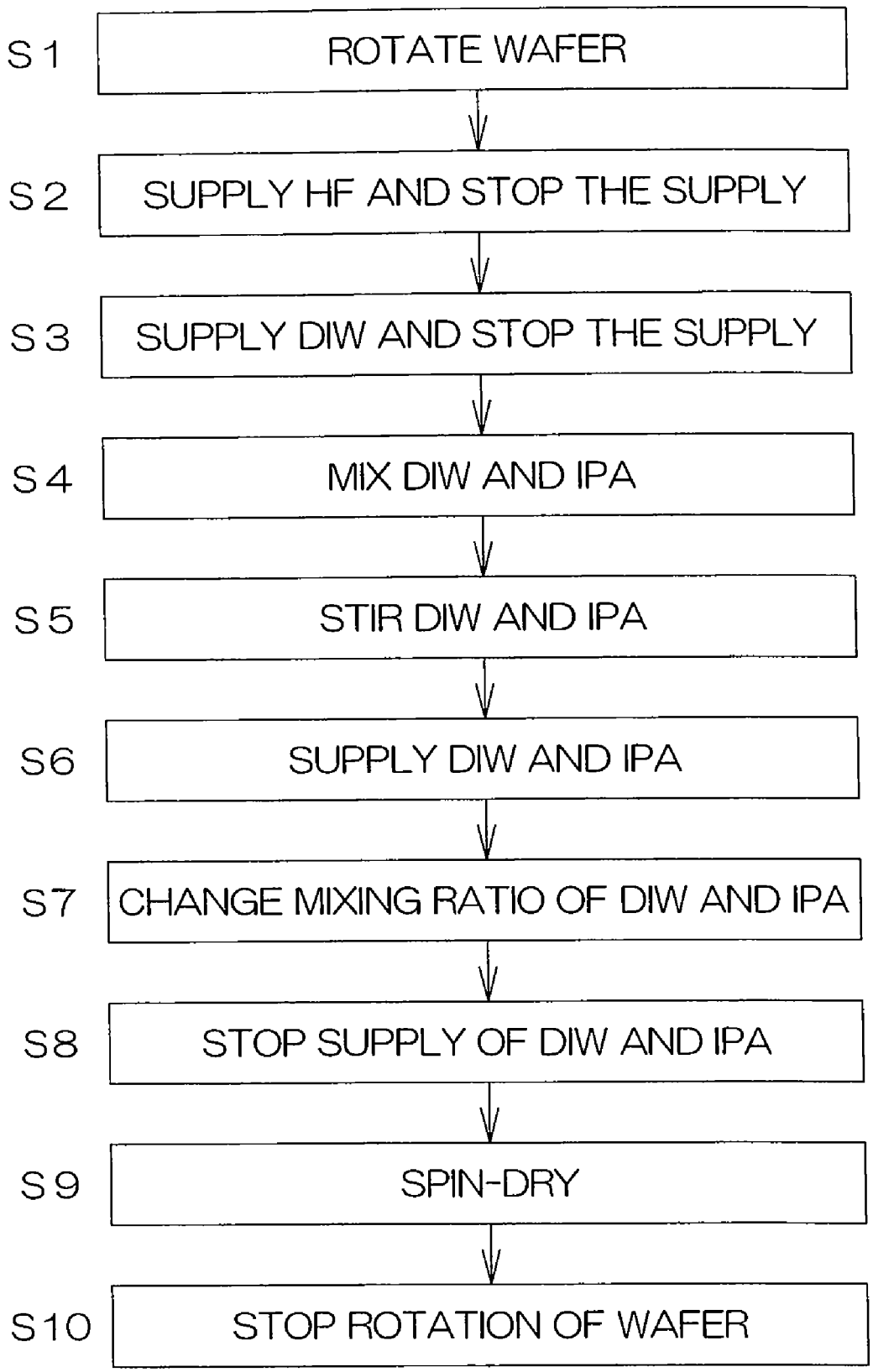
FIG. 3 is a flow chart for explaining a wafer treatment according to the first embodiment of the present invention.
Figure 4:
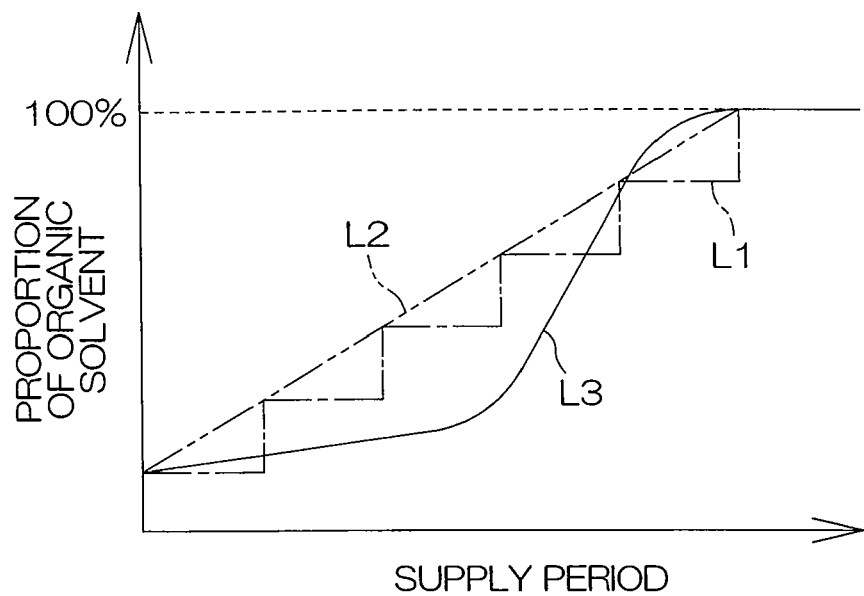
FIG. 4 is a diagram showing a relationship between the proportion of an organic solvent in a deionized water/organic solvent mixture and time during the supply of the mixture to a wafer surface.

FIG. 3 is a flow chart for explaining a treatment of the wafer W according to the first embodiment of the present invention. FIG. 4 is a diagram showing a relationship between the proportion of the organic solvent (IPA) in a deionized water/organic solvent (IPA) mixture and time during the supply of the mixture to the surface of the wafer W. With reference to FIGS. 3 and 4, description will be provided to a treatment of a wafer W having a recess such as a hole or a trench of a high aspect ratio in its surface.

The wafer W to be treated is transported in by a transport robot not shown, and transferred onto the spin chuck 1 from the transport robot. Thereafter, a drive force is inputted to the rotation shaft 3 from the rotative drive mechanism 6, whereby the wafer W held by the spin chuck 1 is rotated at a predetermined rotation speed (Step S1, a substrate rotating step).

Then, the control unit 24 opens the hydrofluoric acid valve 16 and closes the deionized water valve 17 and the IPA valve 18 to supply hydrofluoric acid to the mixing valve 10 from the hydrofluoric acid supply channel 12. Hydrofluoric acid supplied to the mixing valve 10 is supplied to the nozzle 2 through the treatment liquid supply channel 11, and further supplied to the vicinity of the rotation center of the surface of the rotated wafer W from the nozzle 2. Hydrofluoric acid supplied to the surface of the wafer W receives a centrifugal force generated by the rotation of the wafer W to spread over the entire surface of the wafer W. Thus, an etching process and a lift-off process for removing impurities (particles, metal impurities and other impurities) resulting from the etching process from the surface of the wafer W are performed on the entire surface of the wafer W. These processes make the surface of the wafer W hydrophobic.

After hydrofluoric acid is supplied to the surface of the wafer W for a predetermined hydrofluoric acid treatment period, the control unit 24 closes the hydrofluoric acid valve 16 to stop the supply of hydrofluoric acid to the wafer W (Step S2). Then, the control unit 24 opens the deionized water valve 17 with the hydrofluoric acid valve 16 and the IPA valve 18 kept closed to supply the deionized water to the vicinity of the rotation center of the surface of the wafer W (Step S3, a cleaning step). At this time, the opening degree of the flow control valve 20 is controlled so as to supply the deionized water to the wafer W at a predetermined supply flow rate.

The deionized water supplied to the surface of the wafer W receives the centrifugal force generated by the rotation of the wafer W to spread over the entire surface of the wafer W. Thus, a cleaning process is performed on the surface of the wafer W to rinse away hydrofluoric acid remaining on the surface of the wafer W by the deionized water. After the deionized water is supplied to the surface of the wafer W for a predetermined cleaning period, the control unit 24 closes the deionized water valve 17 to stop the supply of the deionized water to the wafer W (Step S3).

In turn, the control unit 24 opens the deionized water valve 17 and the IPA valve 18 to supply the deionized water and IPA to the mixing valve 10 from the deionized water supply channel 13 and the IPA supply channel 14, respectively. At this time, the opening degree of the flow control valve 20 is controlled so as to supply the deionized water to the mixing valve 10 at a predetermined deionized water initial flow rate (e.g., 900 ml/min), and the opening degree of the flow control valve 21 is controlled so as to supply IPA to the mixing valve 10 at a predetermined IPA initial flow rate (e.g., 100 ml/min).

The deionized water and IPA supplied to the mixing valve 10 are mixed in the mixing valve 10 to provide a deionized water/IPA mixture mainly containing the deionized water (Step S4), and the deionized water/IPA mixture is supplied to the treatment liquid supply channel 11 at a predetermined mixture supply flow rate (e.g., 1000 ml/min). The deionized water/IPA mixture supplied to the treatment liquid supply channel 11 is stirred in the finned stirring communication pipe 23 (Step S5, a stirring step), and supplied as a pre-drying treatment liquid to the vicinity of the rotation center of the surface of the wafer W from the nozzle 2 (Step S6, a deionized water/organic solvent mixture supplying step). The deionized water/IPA mixture supplied to the surface of the wafer W receives the centrifugal force generated by the rotation of the wafer W to spread over the entire surface of the wafer W.

Thus, a deionized water/IPA pre-drying treatment process is performed to replace deionized water remaining on the surface of the wafer W with the deionized water/IPA mixture after the cleaning process. The deionized water/IPA mixture supplied to the surface of the wafer W is close in composition to the deionized water and, therefore, easily mingles with the deionized water remaining on the surface of the wafer W.

Then, the control unit 24 changes the mixing ratio of the deionized water and IPA in the deionized water/IPA mixture to be supplied to the surface of the wafer W by controlling the opening degrees of the flow control valves 20, 21, as the deionized water/IPA pre-drying treatment process proceeds (Step S7, a mixing ratio changing step). More specifically, the control unit 24 reduces the opening degree of the flow control valve 20 and increases the opening degree of the flow control valve 21 to increase the proportion of IPA in the deionized water/IPA mixture.

As shown in FIG. 4, the proportion of IPA in the deionized water/IPA mixture may be increased stepwise (as indicated by a one-dot-and-dash line L1) or linearly (as indicated by a two-dot-and-dash line L2) with time during a deionized water/IPA mixture supply period. Alternatively, the proportion of IPA in the deionized water/IPA mixture may be gradually increased at the initial stage, and steeply increased at the middle and final stages in the deionized water/IPA mixture supply period (as indicated by a solid line L3). Where a deionized water/IPA mixture supply position at which the deionized water/IPA mixture is supplied is scanned on the wafer W, the proportion of IPA is preferably increased stepwise so that the mixing ratio of the deionized water and IPA in the mixture is constant during each scanning period (a period in which the supply position is moved from a scanning start position to a scanning end position). For example, the rotation center of the wafer W may be defined as the scanning start position, and a circumferential position of the wafer W may be defined as the scanning end position. Alternatively, the surface of the wafer W may be scanned along a path extending generally diametrically of the wafer W through the rotation center of the wafer W from a first circumferential position of the wafer W defined as the scanning start position to a second circumferential position of the wafer W defined as the scanning end position. The deionized water/IPA mixture to be supplied to the surface of the wafer W preferably contains IPA in a proportion of 100% at the end of the deionized water/IPA mixture supply period, and the proportion of IPA is more preferably kept at 100% for a prolonged period which may be set to the longest possible period in view of the IPA supply amount and the treatment period.

Since the deionized water/IPA mixture to be supplied to the surface of the wafer W is close in composition to the deionized water/IPA mixture present on the surface of the wafer W at any time during the increase of the proportion of IPA in the deionized water/IPA mixture, the newly supplied deionized water/IPA mixture properly mingles with the deionized water/IPA mixture present on the surface of the wafer W. Thus, the deionized water present on the surface of the wafer W is assuredly replaced with IPA in the deionized water/IPA mixture.

After the change of the mixing ratio of the deionized water and IPA in the mixture is completed and the deionized water/IPA mixture is further supplied for a predetermined deionized water/IPA pre-drying treatment period (e.g., several seconds to a few minutes), the control unit 24 closes the deionized water valve 17 and the IPA valve 18 to stop the supply of the deionized water/IPA mixture to the surface of the wafer W (Step S8).

Thereafter, the control unit 24 controls the rotative drive mechanism 6 to increase the rotation speed of the wafer W to a predetermined spin-drying rotation speed (e.g., 3000 rpm), whereby a spin-drying process is performed to spin away the deionized water/IPA mixture remaining on the surface of the wafer W for drying the wafer W (Step S9, a drying step). The spin-drying process is performed for a predetermined spin-drying period (e.g., 30 seconds). After the spin-drying process, the rotation speed of the wafer W is reduced to stop the rotation of the wafer W (Step S10), and the treated wafer W is transported from the spin chuck 1 by the transport robot not shown.

According to the first embodiment described above, even if the wafer W has a recess such as a hole or a trench of a high aspect ratio in the surface thereof, the initially supplied deionized water/IPA mixture easily mingles with the deionized water remaining in the recess, and the thereafter supplied deionized water/IPA mixture which contains IPA in a progressively increased proportion easily mingles with the liquid present in the recess. Thus, the deionized water present in the recess of the high aspect ratio is assuredly replaced with IPA.

The proportion of IPA in the deionized water/IPA mixture is increased as the deionized water/IPA mixture is supplied to the surface of the wafer W, whereby the deionized water remaining on the surface of the wafer W is replaced with the more volatile deionized water/IPA mixture and finally with the deionized water/IPA mixture mainly containing IPA (or IPA alone). That is, the deionized water is progressively replaced with IPA. Thus, the wafer W is speedily and sufficiently dried in the drying step. Even if the wafer W has a recess of a high aspect ratio in the surface thereof, the formation of water marks in the recess is suppressed or prevented. Even if the wafer W has a hydrophobic surface on which liquid droplets are liable to remain, the wafer W is sufficiently dried with no liquid droplets left on the surface thereof. That is, the liquid droplets, which are one cause of the formation of the water marks, do not remain when the wafer W is dried. Therefore, the formation of the water marks on the surface of the wafer W is suppressed or prevented.

Figure 5:
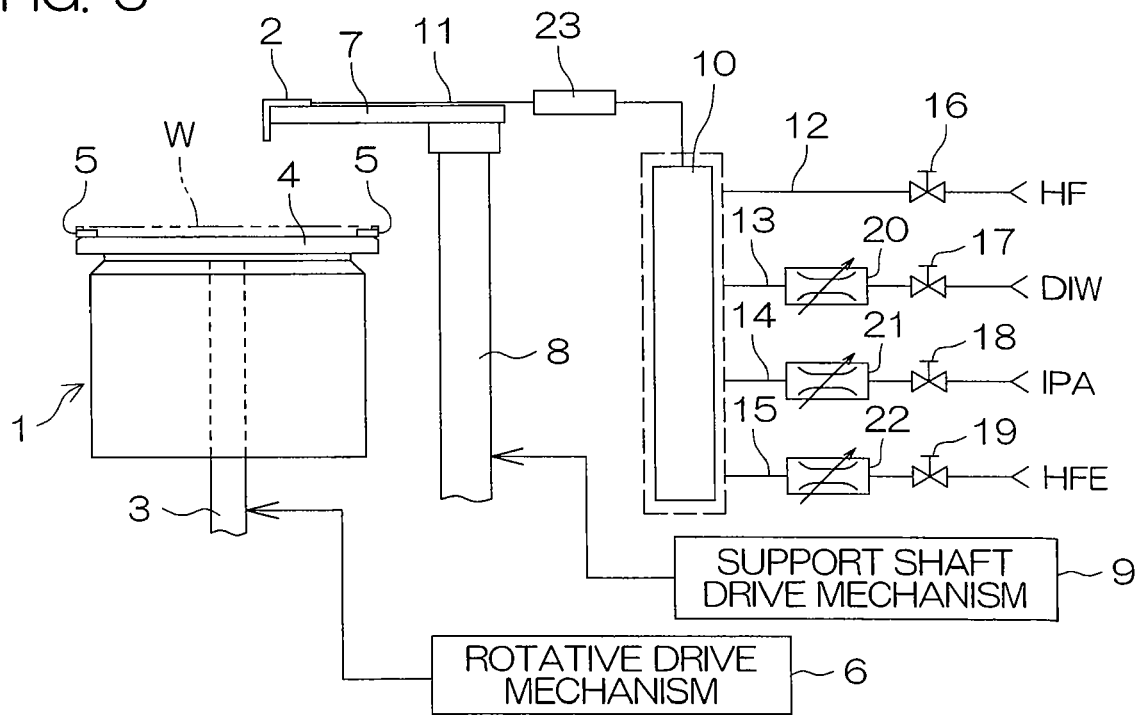
FIG. 5 is a schematic diagram for explaining the construction of a substrate treatment apparatus according to a second embodiment of the present invention.
Figure 6:
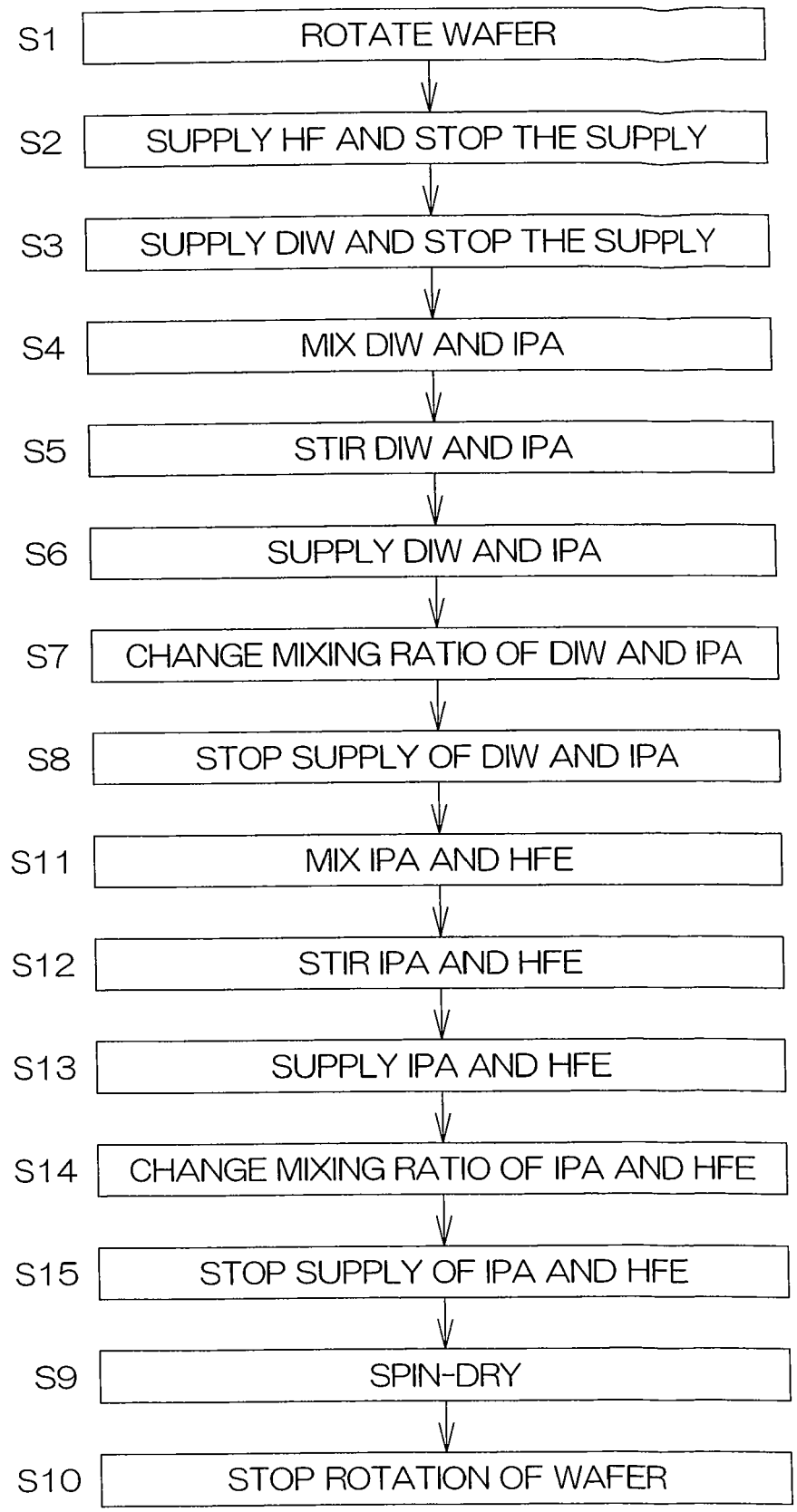
FIG. 6 is a flow chart for explaining a wafer treatment according to the second embodiment of the present invention.

FIG. 5 is a schematic diagram for explaining the construction of a substrate treatment apparatus according to a second embodiment of the present invention. FIG. 6 is a flow chart for explaining a treatment of the wafer W according to the second embodiment of the present invention. In FIGS. 5 and 6, components equivalent to those shown in FIGS. 1 and 3 will be denoted by the same reference characters as in FIGS. 1 and 3.

A major difference in construction between the substrate treatment apparatuses shown in FIGS. 5 and 1 is that an HFE supply channel 15 for supplying an HFE (hydrofluoroether) as a second organic solvent more volatile than IPA (first organic solvent) is connected to the mixing valve 10, and an HFE valve 19 and a flow control valve 22 associated with the HFE supply channel 15 are provided in the HFE supply channel 15. The opening and closing of the HFE valve 19 and the opening degree of the flow control valve 22 are controlled by the control unit 24 (see FIG. 2). In this embodiment, the deionized water supply channel 13, the IPA supply channel 14, the HFE supply channel 15, the deionized water valve 17, the IPA valve 18, the HFE valve 19 and the like constitute a pre-drying treatment liquid supplying unit. The flow control valves 20, 21, 22 and the like constitute a mixing ratio changing unit.

The HFE is an organic solvent which is soluble in IPA but insoluble in the deionized water. Examples of the HFE include those represented by chemical formula $C_4F_9OCH_3$ and $C_4F_9OC_2H_5$ (e.g., HFEs available from Sumitomo 3M Ltd. under the trade name of NOVEC HFE).

With reference to FIGS. 2 and 4 to 6, description will hereinafter be provided to a treatment process to be performed by the substrate treatment apparatus shown in FIG. 5 on a wafer W having a recess such as a hole or a trench of a high aspect ratio in its surface.

The wafer W to be treated is first transported in by the transport robot not shown, and transferred onto the spin chuck 1 from the transport robot. Thereafter, a drive force is inputted to the rotation shaft 3 from the rotative drive mechanism 6, whereby the wafer W held by the spin chuck 1 is rotated at a predetermined rotation speed (Step S1, a substrate rotating step).

Then, the control unit 24 opens the hydrofluoric acid valve 16 and closes the deionized water valve 17, the IPA valve 18 and the HFE valve 19 to supply hydrofluoric acid to the mixing valve 10 from the hydrofluoric acid supply channel 12. Hydrofluoric acid supplied to the mixing valve 10 is supplied to the nozzle 2 through the treatment liquid supply channel 11, and further supplied to the vicinity of the rotation center of the surface of the rotated wafer W from the nozzle 2. Hydrofluoric acid supplied to the surface of the wafer W receives a centrifugal force generated by the rotation of the wafer W to spread over the entire surface of the wafer W. Thus, an etching process and a lift-off process for removing impurities (particles, metal impurities and other impurities) resulting from the etching process from the surface of the wafer W are performed on the entire surface of the wafer W. These processes make the surface of the wafer W hydrophobic.

After hydrofluoric acid is supplied to the surface of the wafer W for a predetermined hydrofluoric acid treatment period, the control unit 24 closes the hydrofluoric acid valve 16 to stop the supply of hydrofluoric acid to the wafer W (Step S2). Then, the control unit 24 opens the deionized water valve 17 with the hydrofluoric acid valve 16, the IPA valve 18 and the HFE valve 19 kept closed to supply the deionized water to the vicinity of the rotation center of the surface of the wafer W (Step S3, a cleaning step). At this time, the opening degree of the flow control valve 20 is controlled so as to supply the deionized water to the wafer W at a predetermined supply flow rate.

The deionized water supplied to the surface of the wafer W receives the centrifugal force generated by the rotation of the wafer W to spread over the entire surface of the wafer W. Thus, a cleaning process is performed on the surface of the wafer W to rinse away hydrofluoric acid remaining on the surface of the wafer W by the deionized water. After the deionized water is supplied to the surface of the wafer W for a predetermined cleaning period, the control unit 24 closes the deionized water valve 17 to stop the supply of the deionized water to the wafer W (Step S3).

In turn, the control unit 24 opens the deionized water valve 17 and the IPA valve 18 to supply the deionized water and IPA to the mixing valve 10 from the deionized water supply channel 13 and the IPA supply channel 14, respectively. At this time, the opening degree of the flow control valve 20 is controlled so as to supply the deionized water to the mixing valve 10 at a predetermined deionized water initial flow rate (e.g., 900 ml/min), and the opening degree of the flow control valve 21 is controlled so as to supply IPA to the mixing valve 10 at a predetermined IPA initial flow rate (e.g., 100 ml/min).

The deionized water and IPA supplied to the mixing valve 10 are mixed in the mixing valve 10 to provide a deionized water/IPA mixture mainly containing the deionized water (Step S4), and the deionized water/IPA mixture is supplied to the treatment liquid supply channel 11 at a predetermined mixture supply flow rate (e.g., 1000 ml/min). The deionized water/IPA mixture supplied to the treatment liquid supply channel 11 is stirred in the finned stirring communication pipe 23 (Step S5, a stirring step), and supplied as a pre-drying treatment liquid to the vicinity of the rotation center of the surface of the wafer W from the nozzle 2 (Step S6, a deionized water/organic solvent mixture supplying step). The deionized water/IPA mixture supplied to the surface of the wafer W receives the centrifugal force generated by the rotation of the wafer W to spread over the entire surface of the wafer W.

Thus, a deionized water/IPA pre-drying treatment process is performed to replace deionized water remaining on the surface of the wafer W with the deionized water/IPA mixture after the cleaning process. The deionized water/IPA mixture supplied to the surface of the wafer W is close in composition to the deionized water and, therefore, easily mingles with the deionized water remaining on the surface of the wafer W.

Then, the control unit 24 changes the mixing ratio of the deionized water and IPA in the deionized water/IPA mixture to be supplied to the surface of the wafer W by controlling the opening degrees of the flow control valves 20, 21, as the deionized water/IPA pre-drying treatment process proceeds (Step S7, a mixing ratio changing step). More specifically, the control unit 24 reduces the opening degree of the flow control valve 20 and increases the opening degree of the flow control valve 21 to increase the proportion of IPA in the deionized water/IPA mixture.

As shown in FIG. 4, the proportion of IPA in the deionized water/IPA mixture may be increased stepwise (as indicated by the one-dot-and-dash line L1) or linearly (as indicated by the two-dot-and-dash line L2) with time during a deionized water/IPA mixture supply period. Alternatively, the proportion of IPA in the deionized water/IPA mixture may be gradually increased at the initial stage, and steeply increased at the middle and final stages in the deionized water/IPA mixture supply period (as indicated by the solid line L3). Where a deionized water/IPA mixture supply position at which the deionized water/IPA mixture is supplied is scanned on the wafer W, the proportion of IPA is preferably increased stepwise so that the mixing ratio of the deionized water and IPA in the mixture is constant during each scanning period. The deionized water/IPA mixture to be supplied to the surface of the wafer W preferably mainly contains IPA, further preferably in a proportion of 100%, at the end of the deionized water/IPA mixture supply period.

Since the deionized water/IPA mixture to be supplied to the surface of the wafer W is close in composition to the deionized water/IPA mixture present on the surface of the wafer W at any time during the increase of the proportion of IPA in the deionized water/IPA mixture, the newly supplied deionized water/IPA mixture properly mingles with the deionized water/IPA mixture present on the surface of the wafer W. Thus, the deionized water remaining on the surface of the wafer W is assuredly replaced with IPA in the deionized water/IPA mixture.

After the change of the mixing ratio of the deionized water and IPA in the mixture is completed and the deionized water/IPA mixture is further supplied for a predetermined deionized water/IPA pre-drying treatment period (e.g., several seconds to a few minutes), the control unit 24 closes the deionized water valve 17 and the IPA valve 18 to stop the supply of the deionized water/IPA mixture to the surface of the wafer W (Step S8).

In turn, the control unit 24 opens the IPA valve 18 and the HFE valve 19 to supply IPA and the HFE to the mixing valve 10 from the IPA supply channel 14 and the HFE supply channel 15, respectively. At this time, the opening degree of the flow control valve 21 is controlled so as to supply IPA to the mixing valve 10 at a predetermined IPA initial flow rate (e.g., 900 ml/min), and the opening degree of the flow control valve 22 is controlled so as to supply the HFE to the mixing valve 10 at a predetermined HFE initial flow rate (e.g., 100 ml/min).

IPA and the HFE supplied to the mixing valve 10 are mixed in the mixing valve 10 to provide an IPA/HFE mixture mainly containing IPA (Step S11), and the IPA/HFE mixture is supplied to the treatment liquid supply channel 11 at a predetermined mixture supply flow rate (e.g., 1000 ml/min). The IPA/HFE mixture supplied to the treatment liquid supply channel 11 is stirred in the finned stirring communication pipe 23 (Step S12, a stirring step), and supplied as a pre-drying treatment liquid to the vicinity of the rotation center of the surface of the wafer W from the nozzle 2 (Step S13, a mixed organic solvent supplying step). The IPA/HFE mixture supplied to the surface of the wafer W receives the centrifugal force generated by the rotation of the wafer W to spread over the entire surface of the wafer W.

Thus, an IPA/HFE pre-drying treatment process is performed to replace the deionized water/IPA mixture remaining on the surface of the wafer W with the IPA/HFE mixture after the deionized water/IPA pre-drying treatment process. The deionized water/IPA mixture remaining on the surface of the wafer W after the supply of the deionized water/IPA mixture mainly contains IPA, and the IPA/HFE mixture to be initially supplied to the surface of the wafer W also mainly contains IPA. Therefore, the initially supplied IPA/HFE mixture easily mingles with the deionized water/IPA mixture remaining on the surface of the wafer W. Even if the deionized water is present in the deionized water/IPA mixture remaining on the surface of the wafer W, the deionized water present in the deionized water/IPA mixture easily mingles with the IPA/

HFE mixture because the initially supplied IPA/HFE mixture mainly contains IPA which is highly soluble in the deionized water.

Then, the control unit 24 changes the mixing ratio of IPA and the HFE in the IPA/HFE mixture to be supplied to the surface of the wafer W by controlling the opening degrees of the flow control valves 21, 22, as the IPA/HFE pre-drying treatment process proceeds (Step S14, an organic solvent mixing ratio changing step). More specifically, the control unit 24 reduces the opening degree of the flow control valve 21 and increases the opening degree of the flow control valve 22 to increase the proportion of the HFE in the IPA/HFE mixture.

Like the proportion of IPA in the deionized water/IPA mixture, the proportion of the HFE in the IPA/HFE mixture may be increased stepwise or linearly with time during an IPA/HFE mixture supply period. Alternatively, the proportion of the HFE in the IPA/HFE mixture may be gradually increased at the initial stage, and steeply increased at the middle and final stages in the IPA/HFE mixture supply period. Where an IPA/HFE mixture supply position at which the IPA/HFE mixture is supplied is scanned on the wafer W, the proportion of the HFE is preferably increased stepwise so that the mixing ratio of IPA and the HFE in the mixture is constant during each scanning period. The IPA/HFE mixture to be supplied to the surface of the wafer W may mainly contain the HFE or contain the HFE in a proportion of 100% at the end of the IPA/HFE mixture supply period.

Since the IPA/HFE mixture to be supplied to the surface of the wafer W is close in composition to the IPA/HFE mixture present on the surface of the wafer W at any time during the increase of the proportion of the HFE in the IPA/HFE mixture, the newly supplied IPA/HFE mixture properly mingles with the IPA/HFE mixture present on the surface of the wafer W. Thus, IPA in the deionized water/IPA mixture remaining on the surface of the wafer W is assuredly replaced with the HFE in the IPA/HFE mixture.

After the change of the mixing ratio of IPA and the HFE in the mixture is completed and the IPA/HFE mixture is further supplied for a predetermined IPA/HFE pre-drying treatment period (e.g., several seconds to a few minutes), the control unit 24 closes the IPA valve 18 and the HFE valve 19 to stop the supply of the IPA/HFE mixture to the surface of the wafer W (Step S15).

Thereafter, the control unit 24 controls the rotative drive mechanism 6 to increase the rotation speed of the wafer W to a predetermined spin-drying rotation speed (e.g., 3000 rpm), whereby a spin-drying process is performed to spin away the IPA/HFE mixture remaining on the surface of the wafer W for drying the wafer W (Step S9). The spin-drying process is performed for a predetermined spin-drying period (e.g., 30 seconds). After the spin-drying process, the rotation speed of the wafer W is reduced to stop the rotation of the wafer W (Step S10), and the treated wafer W is transported from the spin chuck 1 by the transport robot not shown.

According to the second embodiment described above, the deionized water remaining on the surface of the wafer W after the cleaning process is first replaced with the deionized water/IPA mixture, which is finally replaced with the IPA/HFE mixture. That is, the deionized water is replaced progressively with IPA and the HFE. Since the mixture (the deionized water/IPA mixture or the IPA/HFE mixture) to be supplied to the wafer W is close in composition to the liquid (containing one or more of the deionized water, IPA and the HFE) remaining on the surface of the wafer W at any time, the liquid present on the wafer W easily mingles with the mixture and is easily replaced with the mixture.

Since the IPA/HFE mixture to be supplied at the final stage of the IPA/HFE pre-drying treatment process mainly contains the HFE which has a lower surface tension, a lower boiling point and a higher volatility than IPA, the wafer W is more speedily and sufficiently dried. Therefore, the formation of water marks is effectively suppressed.

The present invention is not limited to the first and second embodiments described above, but various modifications may be made within the scope of the invention defined by the appended claims. The first and second embodiments described above employ IPA and/or the HFE as the organic solvent more volatile than the deionized water by way of example. However, an organic solvent having a lower surface tension with respect to the wafer W and a higher vapor pressure (lower boiling point) than the deionized water, for example, an organic solvent containing one or more of methanol, ethanol, acetone, IPA (isopropyl alcohol), HFEs (hydrofluoroethers) and MEK (methyl ethyl ketone) may be used as the organic solvent.

Here, the boiling point of the organic solvent is regarded as an index of the volatility of the organic solvent. The boiling points of typical organic solvents at the atmospheric pressure are as follows: IPA 82° C.; methanol 65° C.; ethanol 78° C.; acetone 56° C.; MEK 80° C.; HFE ($C_4F_9OCH_3$) 61° C.; and HFE ($C_4F_9OC_2H_5$) 76° C. The boiling points of mixtures of organic solvents are as follows: a mixture of 50% HFE ($C_4F_9OCH_3$) and 50% trans-1,2-dichloroethylene 41° C.; a mixture of 52.7% HFE ($C_4F_9OCH_3$), 44.6% trans-1,2-dichloroethylene and 2.7% ethanol 40° C.; and a mixture of 95% HFE ($C_4F_9OCH_3$) and 5% IPA 54.5° C. That is, these organic solvents and organic solvent mixtures each have a lower boiling point than the deionized water (100° C.) and hence a higher volatility.

These organic solvents and organic solvent mixtures are listed in descending order of volatility (in ascending order of boiling point) as follows: the mixture of 52.7% HFE ($C_4F_9OCH_3$), 44.6% trans-1,2-dichloroethylene and 2.7% ethanol>the mixture of 50% HFE ($C_4F_9OCH_3$) and 50% trans-1,2-dichloroethylene>the mixture of 95% HFE ($C_4F_9OCH_3$) and 5% IPA>acetone>HFE ($C_4F_9OCH_3$)>methanol>HFE ($C_4F_9OC_2H_5$)>ethanol>MEK>IPA. In the second embodiment, therefore, any two of the aforementioned organic solvents may be employed in combination as the first organic solvent and the second organic solvent instead of IPA and the HFE on the condition that the second organic solvent is more volatile than the first organic solvent. The second organic solvent may be much more volatile than the first organic solvent, as long as the treatment processes can be smoothly performed.

In the first and second embodiments described above, the proportion of IPA in the deionized water/IPA mixture or the proportion of the HFE in the IPA/HFE mixture are progressively increased, but this is not limitative. The mixing ratio changing step (S7 or S14) may be performed in a period during which the deionized water/IPA mixture is supplied to the wafer W in Steps S6 to S8 or during which the IPA/HFE mixture is supplied to the wafer W in Steps S13 to S15. The mixing ratio may be changed at least once in this period. However, the proportion of IPA or the HFE is preferably increased progressively as indicated by the one-dot-and-dash line L1, the two-dot-and-dash line L2 or the solid line L3 in FIG. 4 to ensure that the replacement of the deionized water with IPA or the replacement of IPA with the HFE is fully facilitated.

In the first and second embodiments described above, the nozzle 2 is a scan nozzle which is capable of scanning the treatment liquid supply position at which the treatment liquid is supplied on the wafer W. However, the nozzle 2 may be a stationary nozzle which is fixed to a predetermined position above the wafer W to supply the treatment liquid to a predetermined position on the wafer W.

In the first embodiment described above, only a deionized water/HFE pre-drying treatment process may be performed to supply a mixture of deionized water and an HFE to the wafer W in a period between the stop of the supply of the deionized water (Step S3) and the spin-drying process (Step S9). That is, the step of mixing the deionized water with the HFE, the step of stirring the resulting mixture, the step of supplying the mixture to the wafer W, the step of changing the mixing ratio for the mixture, and the step of stopping the supply of the mixture may be employed instead of Steps S4 to S8 in FIG. 3. In this case, however, the HFE is less soluble in the deionized water and, therefore, does not completely mingle with the deionized water in the mixture. This may hinder the smooth replacement of the deionized water with the mixture. Therefore, IPA which is highly soluble in both the deionized water and the HFE is preferably employed between the deionized water and the HFE as in the second embodiment (see FIG. 6) in order to facilitate the replacement with the mixture. This makes it possible to perform the pre-drying treatment process more advantageously.

In the first and second embodiments described above, the substrate (wafer W) generally horizontally held and rotated is treated by supplying the treatment liquid to the surface of the substrate. However, the treatment liquid may be supplied to the substrate in a non-rotating state for the treatment of the substrate. The term "non-rotating state" herein means that the substrate is neither rotated nor moved (in a stationary state) or that the substrate is not rotated but moved in a predetermined direction (in a moving state).

In the first and second embodiments described above, the wafer W is employed as the substrate to be treated. However, the substrate to be treated is not limited to the wafer W, and other examples of the substrate include substrates for liquid crystal display devices, substrates for plasma display devices, substrates for FEDs, substrates for optical disks, substrates for magnetic disks, substrates for magneto-optical disks, and substrates for photo masks.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2006-169142 filed in the Japanese Patent Office on Jun. 19, 2006, the disclosure of which is incorporated herein by reference.

What is claimed is:

1. A substrate treatment method comprising:
    a cleaning step of supplying deionized water to a major surface of a substrate to be treated to clean the substrate;
    a pre-drying treatment step of supplying a pre-drying treatment liquid to the major surface of the substrate after the cleaning step to replace deionized water remaining on the major surface with the pre-drying treatment liquid; and
    a drying step of removing the pre-drying treatment liquid supplied to the major surface of the substrate after the pre-drying treatment step to dry the substrate;
    the pre-drying treatment step including:
    a deionized water/organic solvent mixture supplying step of supplying a mixture of the deionized water and a first organic solvent as the pre-drying treatment liquid to the major surface of the substrate;
    a mixing ratio changing step of increasing a proportion of the first organic solvent in the mixture of the deionized water and the first organic solvent during the deionized water/organic solvent mixture supplying step;
    a mixed organic solvent supplying step of supplying, after the deionized water/organic solvent mixture supply step, a mixture of the first organic solvent and a second organic solvent as the pre-drying treatment liquid to the major surface of the substrate; and
    an organic solvent mixing ratio changing step of increasing a proportion of the second organic solvent in the mixture of the first and second organic solvents during the mixed organic solvent supplying step,
    wherein the first organic solvent is more volatile than the deionized water, the second organic solvent is more volatile than the first organic solvent, and the first organic solvent is more soluble in the deionized water than the second organic solvent.

2. A substrate treatment method as set forth in claim 1, wherein the first and second organic solvents respectively contains at least one of methanol, ethanol, acetone, IPA (isopropyl alcohol), an HFE (hydrofluoroether) and MEK (methyl ethyl ketone).

3. A substrate treatment method as set forth in claim 1, wherein the major surface of the substrate is hydrophobic before the cleaning step.

4. A substrate treatment method as set forth in claim 1, wherein the pre-drying treatment step further includes a stirring step of stirring the pre-drying treatment liquid before supplying the pre-drying treatment liquid to the major surface of the substrate.

5. A substrate treatment method as set forth in claim 1, further comprising a substrate rotating step of rotating the substrate about an axis intersecting the major surface of the substrate, the substrate rotating step being performed in parallel with the cleaning step, the pre-drying treatment step and the drying step.

6. A substrate treatment method as set forth in claim 1, wherein the organic solvent mixing ratio changing step increases the proportion of the second organic solvent in the mixture of the first and second organic solvents up to 100% at a final stage of the mixed organic solvent supplying step.

* * * * *